United States Patent [19]

McKelvey

[11] 4,443,318

[45] Apr. 17, 1984

[54] CATHODIC SPUTTERING APPARATUS

[75] Inventor: Harold E. McKelvey, Plymouth, Mich.

[73] Assignee: Shatterproof Glass Corporation, Detroit, Mich.

[21] Appl. No.: 523,928

[22] Filed: Aug. 17, 1983

[51] Int. Cl.$^3$ ............................................. C23C 15/00
[52] U.S. Cl. ................................ 204/298; 204/192 R
[58] Field of Search ....................................... 204/298

[56] References Cited

U.S. PATENT DOCUMENTS

| | | | |
|---|---|---|---|
| 4,221,652 | 9/1980 | Kuriyama | 204/298 |
| 4,290,877 | 9/1981 | Blickensderfer | 204/298 |
| 4,356,073 | 10/1982 | McKelvey | 204/298 |
| 4,374,722 | 2/1983 | Zega | 204/298 |
| 4,376,025 | 3/1983 | Zega | 204/298 |

Primary Examiner—Arthur P. Demers
Attorney, Agent, or Firm—William E. Nobbe

[57] ABSTRACT

A rotatable magnetron cathode comprising an elongated cylindrical tubular member, magnetic means disposed in said tubular member, a plurality of individual target strips provided with the same or different coating materials to be sputtered removably secured to the tubular member, said target strips extending the axial direction of the tubular member and disposed in spaced parallel relation around the periphery thereof, and means for rotating or indexing the tubular member to bring selected target strips in position for sputtering opposite the magnetic means.

15 Claims, 3 Drawing Figures

CATHODIC SPUTTERING APPARATUS

BACKGROUND OF THE INVENTION

The present invention relates to cathodic sputtering apparatus and more particularly to an improved rotatable magnetron cathode.

In U.S. Pat. No. 4,356,073, issued Oct. 26, 1982, the rotatable cathode therein disclosed is mounted in an evacuable coating chamber and comprises an elongated cylindrical tubular member rotatable about its longitudinal axis and having a layer of the desired coating material, which is to be sputtered upon substantially planar substrates as they move through the coating chamber, applied directly to the outer surface thereof.

It is also stated in the patent that by applying different coating materials to different portions or segments of the outer surface of the rotatable tubular member a particular selected coating material can be brought into sputtering position. In this way, it is possible to sputter different coating materials onto the substrates from a single source.

This method of sputtering different coating materials from the same target is, however, subject to certain definite limitations. Thus, when a particular portion or segment of the coating material has been depleted the cathode must be removed from the coating chamber, the surface cleaned to remove any of the depleted coating material remaining on the cathode and a fresh coating applied.

The removal of the cathode from the apparatus, the cleaning thereof and the application of a fresh coating material is expensive and time consuming. There are increased labor costs as well as the loss of productivity of the cathode during this period. There is also the danger that the fresh coating material when applied, will overlap adjacent different coating materials. The cleaning of the cathode is necessary because the coating material is not evenly eroded and some material remains after depletion.

SUMMARY OF THE INVENTION

This invention contemplates an improved rotatable magnetron cathode of novel construction for sputtering different coating materials, in which the depleted coating material can be easily and quickly replaced with fresh coating material of the same or different type.

Another object of the invention is to provide a rotatable magnetron cathode comprising an elongated cylindrical tubular member having a plurality of individual target strips removably secured to said tubular member, said target strips extending axially of the tubular member and arranged in spaced parallel relation around the periphery thereof.

Another object of the invention is to provide a rotatable magnetron cathode of the above character having magnetic means mounted in said tubular member, and means for rotating the tubular member to bring the selected target strip or strips into sputtering position opposite the magnetic means.

A further object of the invention is to provide a magnetron cathode sputtering apparatus in which a rotatable cathode of the above character is mounted in an evacuable coating chamber and in which means is provided in said coating chamber for transporting substantially planar substrates to be coated past the target strip or strips located in sputtering position to receive the material sputtered therefrom.

DESCRIPTION OF THE PREFERRED EMBODIMENT

Figure 1:
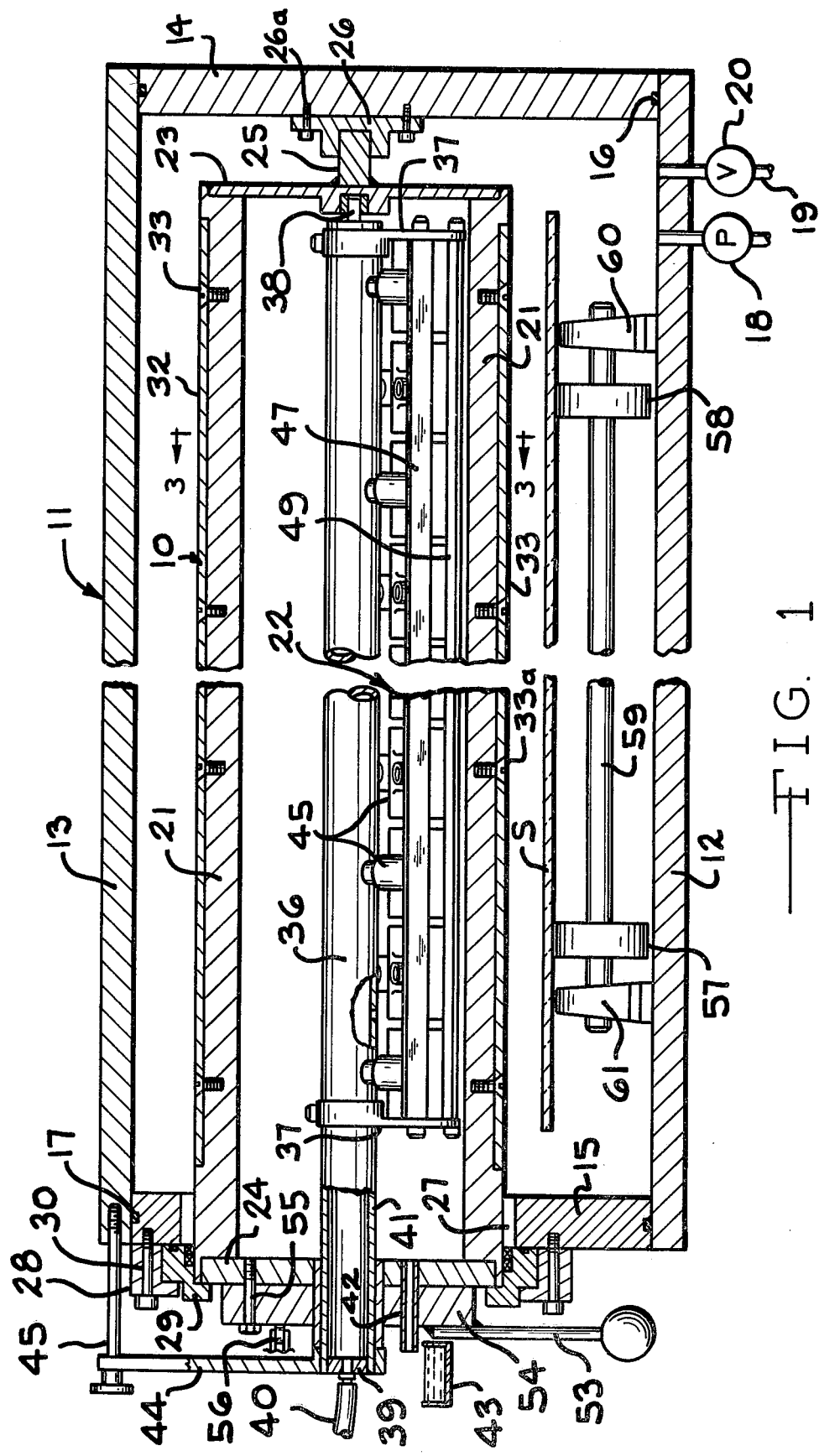
FIG. 1 is a vertical longitudinal section through a coating chamber showing, in elevation, a magnetron cathode constructed in accordance with the present invention mounted therein.

Referring now to the drawings, the cathode assembly is designated in its entirety by the numeral 10 and is mounted horizontally in an evacuable coating chamber 11. The coating chamber is substantially rectangular and is composed of a bottom wall 12, top wall 13, opposite end walls 14 and 15 and side walls (not shown). The bottom and top walls 12 and 13 are suitably joined to the end walls 14 and 15 at the hermetic seals 16 and 17 respectively. The side walls are similarly sealed to the top and bottom and end walls. A vacuum pump 18 is provided to evacuate the coating chamber 11 to the desired pressure. Should it be desired to inject gases into the chamber, it may be done through a conduit 19 controlled by a valve 20.

The cathode assembly 10 comprises an elongated, cylindrical tubular member 21 mounted in the coating chamber 10 and in the lower portion of which is mounted the magnetic means 22. The The tubular member 21 is formed of a suitable non-magnetic material such as, for example, brass or stainless steel and is of a diameter, wall thickness and length required for the operation to be performed. The tubular member 21 is closed at its opposite ends by the inner and outer end walls 23 and 24 respectively. The inner end wall 23 is supported by a trunnion 25 received in a bracket 26 secured to the end wall 14 of the coating chamber by machine screws or the like 26a. The tubular member is supported at its outer end in a bushing 27 in the end wall 15 of coating chamber 11. Sealing collars 28 and 29 surround the tubular member 21 and are secured to the end wall 15 of the coating chamber by screws 30.

As stated above, it has been customary to apply the coating material directly to the outer surface of the tubular member. However, according to this invention, a plurality of individual target strips 31 are provided, with each strip having applied to the outer surface thereof a desired coating material 32 to be sputtered. The target strips may be of any preferred width and extend lengthwise of the tubular member substantially the length thereof. The target strips are arranged in spaced parallel relation to one another around the periphery of the tubular member.

The target strips 31 are removably secured to the tubular member by clamping bars 33 located between adjacent target strips and secured to said tubular member by machine screws 33a. The target strips are received in recesses 34 in the tubular member and are provided along opposite side edges with flanges 35 which are engaged by the clamping bars 33 to securely hold them in place. It will thus be evident that when the coating material on any one target strip has been depleted, the strip can be readily removed by removing the screws 33a and a new strip with fresh coating material easily and quickly substituted therefor. The operation of the coating appararus can then be resumed, while the removed strip can be cleaned and fresh coating material applied thereto. In this way, a major saving in time and cost of operation of the apparatus can be achieved.

To provide for the requisite cooling of the cathode assembly during operation, there is provided a coolant conduit 36 also made of a suitable non-magnetic material and extending longitudinally within the lower portion of the tubular member 21 and from which the magnetic means 22 is suspended by hanger straps 37. The inner end of said conduit 36 is provided with a trunnion 38 supported in the end wall 23 of the tubular member.

The outer end portion of the coolant conduit extends through an opening in the end wall 24 of the tubular member 21 and is closed by a cap 39. A cooling medium, such as water, is introduced into the outer end of the coolant conduit 36 through a pipe 40 and exits therefrom through openings 41 in said conduit. After circulating through the cathode, the cooling medium is discharged therefrom through a pipe 42 into a receptacle or the like 43.

The coolant conduit 36 is maintained in a fixed position and for this purpose there is provided a locking bar 44 secured at its lower end to the coolant conduit and at its upper end to the top wall 13 of the coating chamber by a rod 45 passing through the locking bar 44 and threaded in said top wall 13 of the coating chamber.

Figure 2:
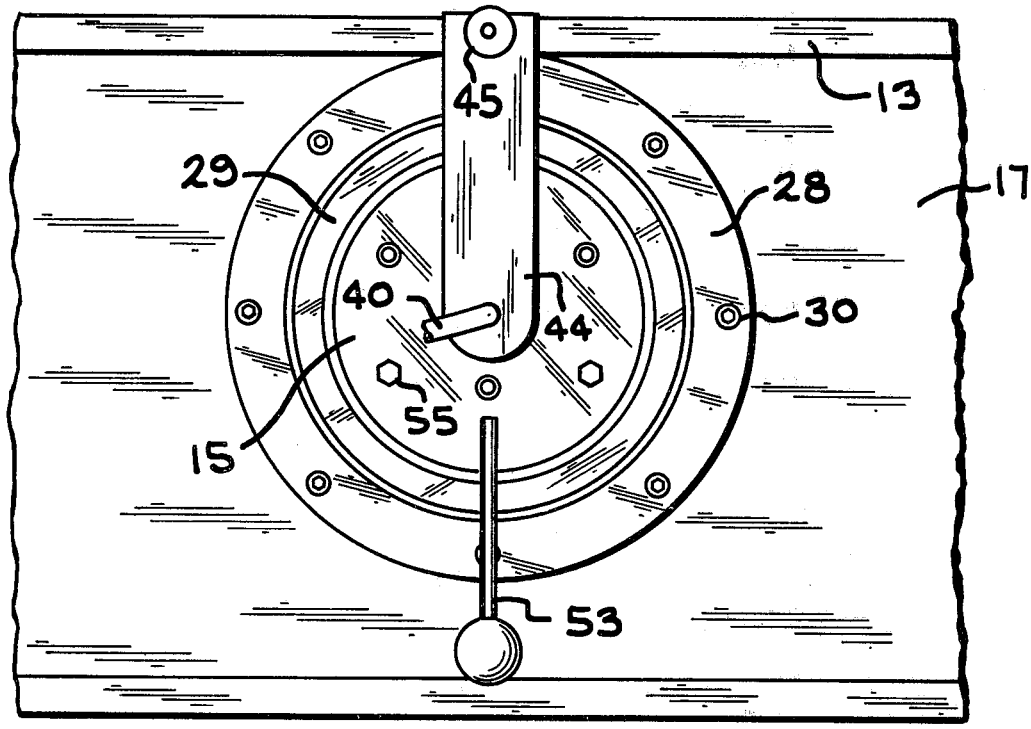
FIG. 2 is an end view of the coating chamber and cathode.

The magnetic means 22 comprises an array of U-shaped permanent magnets 45 arranged in two straight parallel rows A and B that extend lengthwise within the tubular member 21. The magnets in the two rows are disposed at an angle relative to one another as shown in FIG. 2 and are secured to the coolant conduit by the aforementioned hanger straps 37.

The magnets 45 extend axially substantially the length of the tubular member and a limited distance circumferentially thereof. The outer legs 46 of the magnets in each of the rows of magnets A and B engage a longitudinally extending, relatively narrow strip 47 of a suitable magnetic material, such as hot rolled mild steel, while the inner legs 48 of the magnets engage a similar magnetic strip 49 arranged parallel with strips 47.

The magnets 45 are secured to the magnetic strips 47 and 49 by screws 50 and 51 respectively. The bottom surfaces 52 of the magnetic strips 47 and 49 are shaped to conform to the curvature of the inner surface of the tubular member and are positioned closely adjacent thereto. The magnets are preferably disposed so that the north poles thereof engage the outer magnetic strips 47 are the south poles engage the magnetic strip 49. It is to be understood, however, that other types of permanent magnets or even electromagnets may be substituted for the permanent U-shaped magnets.

By rotating the tubular member 21, the desired target strip or strips can be brought opposite the magnets and in position for sputtering. The rotation or indexing of the tubular member may be accomplished either automatically or manually, as desired, such as by means of an operating lever 53 secured to an annular collar 54 which, in turn, is secured to the end wall 24 of the tubular member 21 by screws 55.

Figure 3:
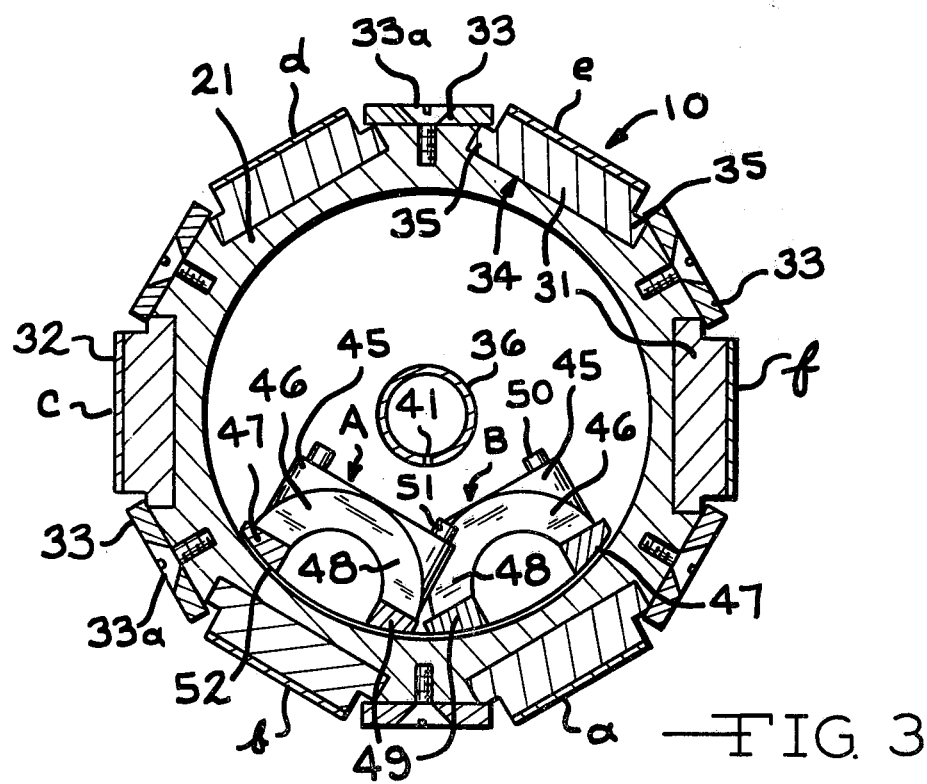
FIG. 3 is a transverse section through the cathode taken substantially on line 3—3 of FIG. 1.

It is preferred that when employing the array of U-shaped magnets illustrated in FIG. 3, the target strips be considered as three pairs a-b, c-d and e-f respectively, with each pair containing a different coating material. Thus, each time the tubular member is indexed one pair of target strips will be brought into sputtering position in relation to the magnets. The invention, however, contemplates a different arrangement of magnets that will allow for the sputtering of only one target strip at a time.

A cathode potential sufficient to cause sputtering to occur is supplied to the tubular member 21 from a D.C. power source (not shown) through an electrical contact 56 connected to the power source and having rolling or sliding contact with said tubular member. The apparatus may be grounded in any suitable manner.

The substantially planar substrates S to be coated are supported upon and carried through the coating chamber 10 beneath the cathode assembly 11 by a conveyor means including rollers 57 and 58 keyed to a horizontal shaft 59 journaled in bearing blocks 60 and 61 supported on the bottom wall of the coating chamber.

It will be understood that changes and modifications may be made without departing from the spirit or scope of the appended claims.

I claim:

1. A rotatable sputtering cathode, comprising an elongated cylindrical tubular member, means for rotating said tubular member, and target means provided with coating material to be sputtered removably secured to said tubular member.

2. A rotatable sputtering cathode as claimed in claim 1, in which said target means comprises a plurality of individual target strips.

3. A rotatable sputtering cathode as claimed in claim 2, in which said target strips extend lengthwise of the tubular member and are arranged in spaced parallel relation around the periphery thereof.

4. A rotatable sputtering cathode as claimed in claim 1, in which said target means comprises a plurality of individual target strips extending lengthwise of said tubular member and arranged in spaced parallel relation around the periphery thereof, and means for removably securing said target strips to said tubular member.

5. A rotatable sputtering cathode as claimed in claim 4, in which said securing means comprises clamping means interposed between adjacent target strips and engaging the same.

6. A rotatable sputtering cathode as claimed in claim 5, in which said clamping means comprises clamping bars arranged between adjacent target strips and having portions overlapping and engaging said target strips, and including means for securing said clamping bars to said tubular member.

7. A rotatable sputtering cathode as claimed in claim 3, including means for internally cooling said tubular member.

8. A rotatable sputtering cathode as claimed in claim 4, including means for circulating a cooling medium through said tubular member.

9. A rotatable sputtering cathode as claimed in claim 1, including magnetic means mounted in said tubular member.

10. A rotatable sputtering cathode as claimed in claim 3, including magnetic means mounted in said tubular member.

11. A rotatable sputtering cathode as claimed in claim 3, including magnetc means mounted in said tubular member and extending lengthwise thereof.

12. A rotatable sputtering cathode as claimed in claim 6, including an array of permanent magnets mounted in said tubular member and extending lengthwise thereof.

13. Magnetron cathode sputtering apparatus, comprising an evacuable coating chamber, a cathode including an elongated cylindrical tubular member mounted horizontally in said chamber, magnetic means mounted in the tubular member, a plurality of individual target strips provided with coating material to be sputtered extending lengthwise of the tubular member and arranged in spaced parallel relation around the periphery thereof, means for removably securing said target strips to the tubular member, means for rotating said tubular member about its longitudinal axis to bring selected target strips into sputtering position opposite the magnetic means, and means for supporting and transporting substrates to be coated horizontally through said coating chamber and beneath said magnetic means.

14. Magnetron cathode sputtering apparatus as claimed in claim 13, in which said magnetic means comprises an array of permanent magnets extending lengthwise of said tubular member.

15. Magnetron cathode sputtering apparatus as claimed in claim 13, including means for circulating a cooling medium through said tubular member.

* * * * *